United States Patent
Yu et al.

(10) Patent No.: US 7,604,377 B2
(45) Date of Patent: Oct. 20, 2009

(54) LED LIGHTING APPARATUS WITH TRANSPARENT FLEXIBLE CIRCUIT STRUCTURE

(75) Inventors: Sam Yu, Taoyuan (TW); Dalong Cheng, Taoyuan (TW)

(73) Assignee: Polytron Technologies, Inc., Taoyuan County (TW)

( * ) Notice: Subject to any disclaimer, the term of this patent is extended or adjusted under 35 U.S.C. 154(b) by 0 days.

(21) Appl. No.: 11/641,879

(22) Filed: Dec. 20, 2006

(65) Prior Publication Data

US 2008/0080181 A1    Apr. 3, 2008

(30) Foreign Application Priority Data

Sep. 29, 2006   (TW) .............................. 95136269 A
Dec. 4, 2006    (TW) .............................. 95145049 A

(51) Int. Cl.
       *F21S 13/14*      (2006.01)
(52) U.S. Cl. .......................... 362/249.04; 362/249.02; 362/249.08
(58) Field of Classification Search ................ 362/227, 362/249, 252, 253, 555, 800, 559, 265, 254, 362/257, 260, 249.02, 249.04, 249.08; 257/88, 257/89, 99; 40/541, 549; 428/901; 313/512; 174/230, 231, 249, 253
See application file for complete search history.

(56) References Cited

U.S. PATENT DOCUMENTS

| | | | | |
|---|---|---|---|---|
| 3,894,225 A * | 7/1975 | Chao | ........................... | 362/249 |
| 4,514,791 A * | 4/1985 | Tokieda | ...................... | 362/249 |
| 4,761,720 A * | 8/1988 | Solow | ......................... | 362/252 |
| 5,162,696 A * | 11/1992 | Goodrich | ...................... | 313/511 |
| 5,623,181 A * | 4/1997 | Suehiro et al. | .............. | 313/512 |
| 5,769,533 A * | 6/1998 | Yamuro et al. | .............. | 362/249 |
| 6,173,517 B1 * | 1/2001 | Eibner et al. | .................. | 40/544 |
| 6,270,236 B1 * | 8/2001 | Brussog | ...................... | 362/249 |
| 6,371,637 B1 * | 4/2002 | Atchinson et al. | ........... | 362/555 |
| 6,619,831 B2 * | 9/2003 | Kanesaka | .................... | 362/555 |
| 2003/0137839 A1* | 7/2003 | Lin | ............................. | 362/249 |
| 2004/0223328 A1* | 11/2004 | Lee et al. | ..................... | 362/249 |
| 2005/0231953 A1* | 10/2005 | Reeh et al. | ................... | 362/260 |

* cited by examiner

*Primary Examiner*—Ismael Negron
(74) *Attorney, Agent, or Firm*—Rosenberg, Klein & Lee

(57) ABSTRACT

A light-emitting diode (LED) lighting apparatus includes a transparent flexible tape with a first transparent pattern and a second transparent pattern, the first transparent pattern being insulated from the second transparent pattern. A plurality of light-emitting diodes is electrically connected with the first transparent pattern. The LED lighting apparatus can also form the first transparent pattern and the second transparent pattern on two sides of the transparent flexible tape, or, furthermore, to form the first transparent pattern and the second transparent pattern stack to generate a multi-story LED lighting apparatus. Such a plane of emitting diode is applied to various display, furniture decoration and lighting.

15 Claims, 9 Drawing Sheets

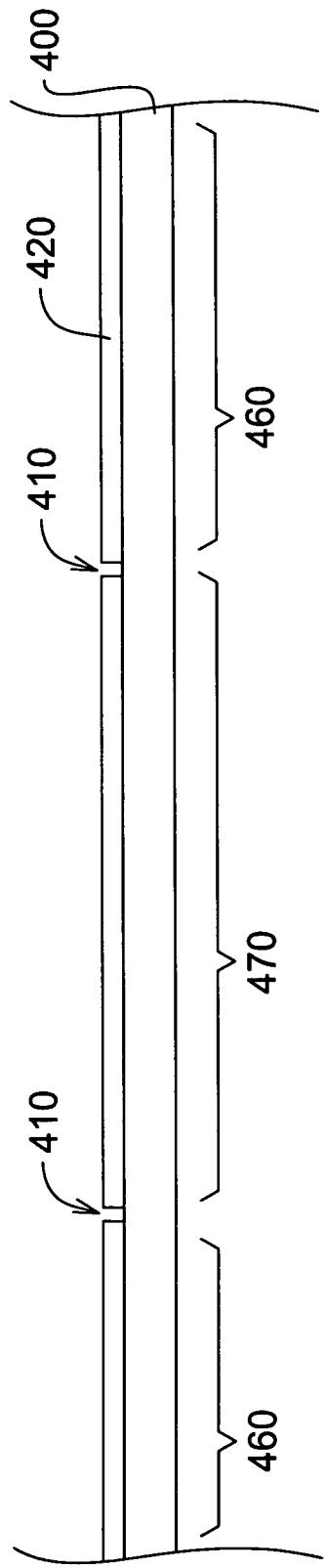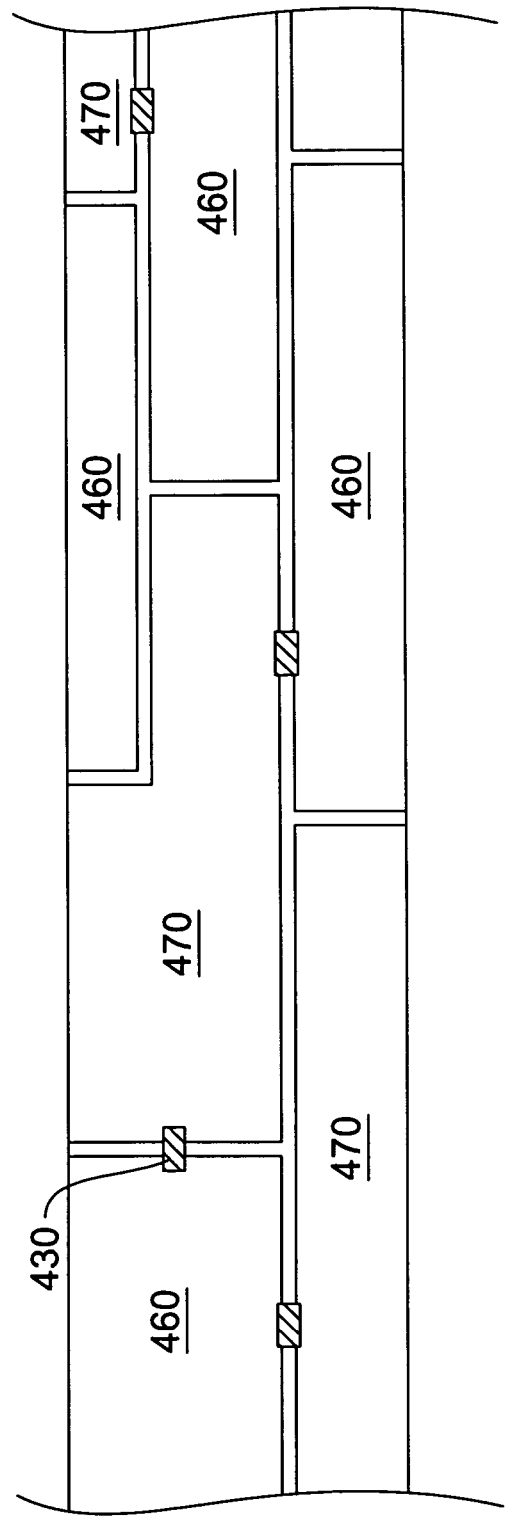
FIG. 2A
FIG. 2B

LED LIGHTING APPARATUS WITH TRANSPARENT FLEXIBLE CIRCUIT STRUCTURE

BACKGROUND OF THE INVENTION

1. Field of the Invention

The present invention relates to a plane structure of a lighting apparatus and more especially, relates to a plane structure of a light-emitting diode lighting apparatus.

2. Description of the Prior Art

With the development and progress of the technology, light-emitting diode (LED) plays an important role on various application due to its low thermal dissipation, low power consumption, long life, quick response, small volume, good vibration resistance, no gas discharge and plate package. Thus, LED may be applied on the products of lighting, prospect design, transportation instruction and electric display.

For example, on the application of prospect beautification, a lighting system with LED may present effects on the varieties of color light not only to provide the function of ambient lighting but also to generate colorful enrichment with low power consumption. However, the application of LED is provided generally with LEDs associated with the layout of circuit fixed or attached onto a hard and opaque carrier, which limits the size, dimensions, shape and viewing effect for an applied product.

SUMMARY OF THE INVENTION

According to the issue mentioned previously, one object of the present invention provides a plane structure of LED lighting apparatus. One or more light-emitting diodes are attached on a plane of flexible material and electrically connected via a specialized transparent pattern of the flexible material plane, which may be applied to decorate the furniture, the glass door, the glass window and interior design to prettify the scenery.

Another object of this invention is to provide a plane structure of light-emitting diode lighting apparatus. Conductive material and insulating pattern are formed on a flexible tape, which may stack one layer or multiple layers of LEDs to diversify the LED deployment and enhance the stereo design to improve effect of prettification and diversion.

Accordingly, one embodiment of the present invention provides a plane structure of light-emitting diode lighting apparatus, it includes: a transparent flexible tape; a first transparent pattern and a second transparent pattern on the transparent flexible tape, wherein the first transparent pattern is electrically insulated from the second transparent pattern; and a plurality of light-emitting diodes electrically connected to the first transparent pattern.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein:

FIG. 2A is a cross-sectional diagram illustrating the plane structure of the LED lighting apparatus in accordance with a third embodiment of the present invention;

FIG. 2B is a cross-sectional diagram illustrating one side of the plane structure of the LED lighting apparatus in accordance with FIG. 2A;

DETAILED DESCRIPTION OF THE INVENTION

The embodiments of the present invention are illustrated in reference to the drawings.

Figure 1A:
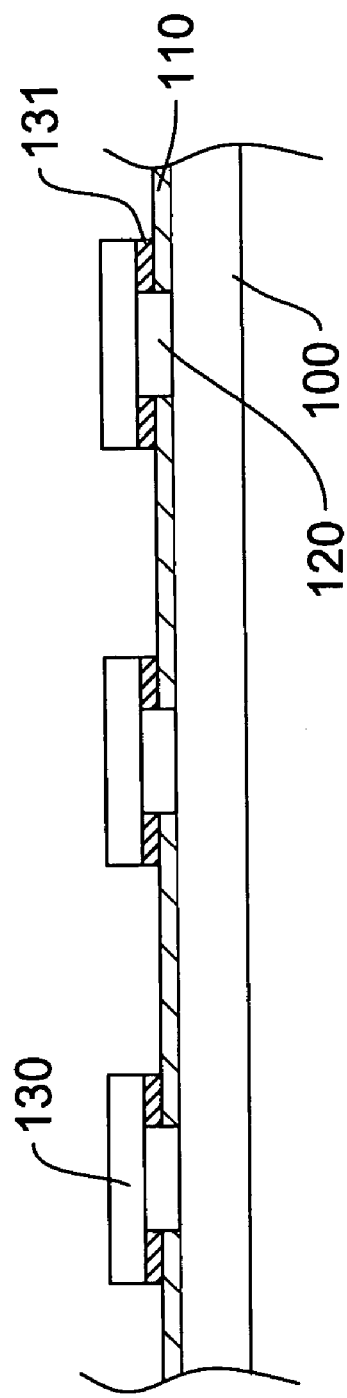
FIG. 1A is a cross-sectional diagram of a plane structure of an LED lighting apparatus in accordance with a first embodiment of the present invention.

FIG. 1A is a cross-sectional diagram of a plane structure of an LED lighting apparatus in accordance with a first embodiment of the present invention. An LED lighting apparatus includes a first transparent pattern and a second transparent pattern 120 on a transparent flexible tape 100. One or more first LEDs 130 are attached to the first transparent pattern with adhesive structures 131. In one embodiment, the transparent flexible tape 100 is made of insulating and flexible material, such as poly (ethylene terephthalate) (PET), poly carbonate (PC), oriented polypropylene (OPP), poly vinylchlorid (PVC), acrylic or other polymer material, but not limited to. Next, the first transparent pattern, such as a first transparent conductive line 110, but not limited to, is made of such as ITO (Indium Tin Oxide), IZO (Indium Zinc Oxide), or acrylic transparent conductive gel, which is formed on the transparent flexible tape 100 by silk screening or printing. It is appreciated that the first transparent conductive line 110 may be dyed for visual arts.

Figure 1B:
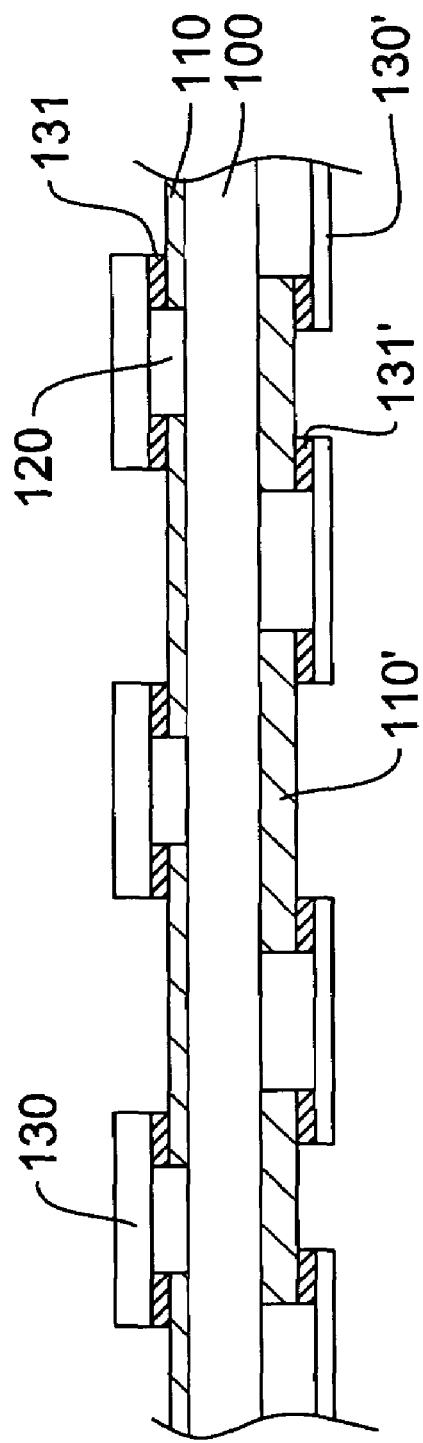
FIG. 1B is a cross-sectional diagram of a plane structure of an LED lighting apparatus in accordance with a second embodiment of the present invention.

Referring to FIG. 1B, is a cross-sectional diagram of a plane structure of an LED lighting apparatus in accordance with a second embodiment of the present invention. In the embodiment, the first transparent pattern further includes a first transparent conductive line 110' positioned on the other surface of the transparent flexible tape 100, and one or more first LEDs 130' are attached to the first transparent conductive line 110' with adhesive structures 131', wherein the first LEDs 130 and 130' are interlaced so as to decrease the pitch between the first LEDs 130 and 130' and, furthermore, to increase flexibility of the designs of the lighting apparatus. It is understood that the forming method of the first transparent conductive lines 110' is the same as that mentioned in the first embodiment.

Figure 1C:
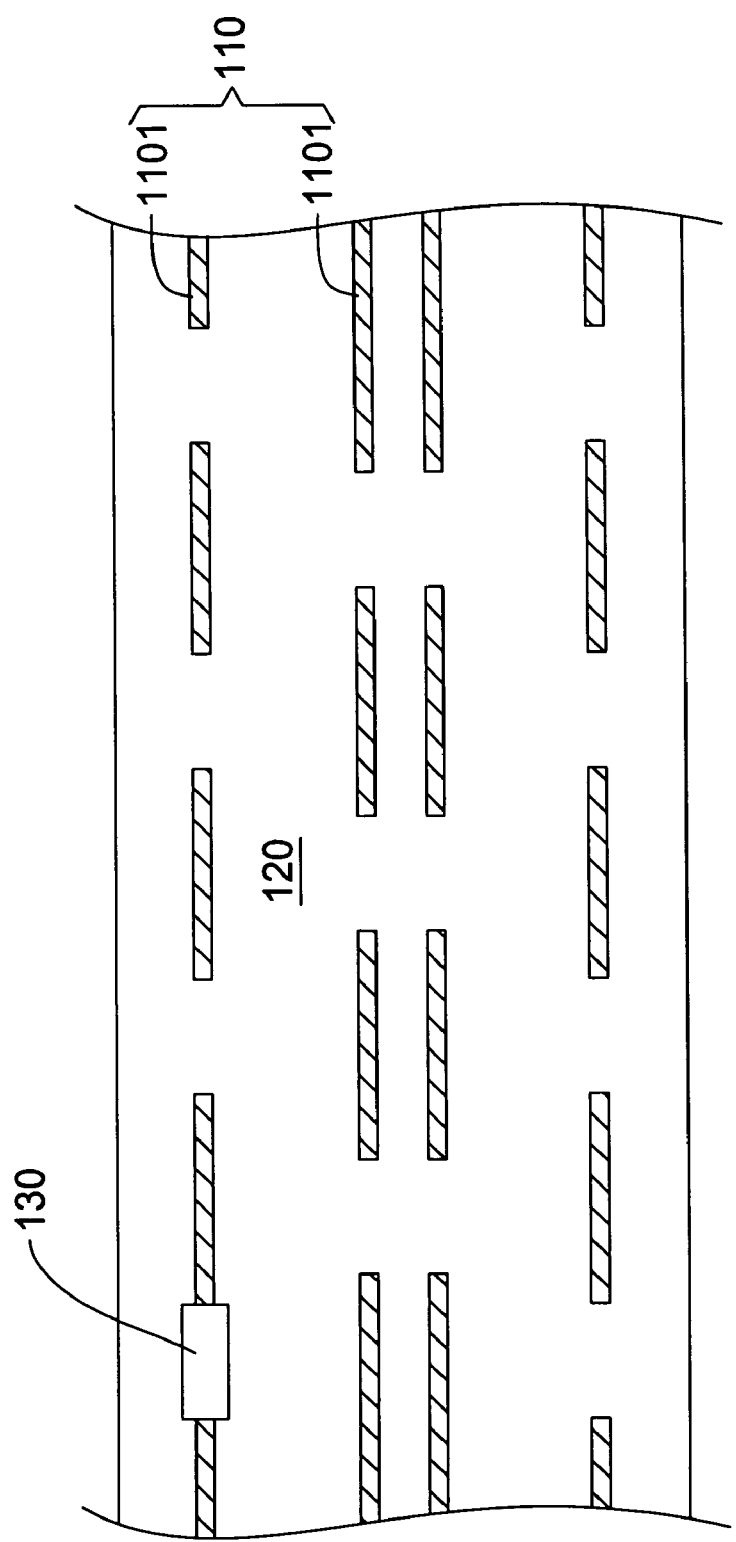
FIG. 1C is a front elevation view of one side of the plane structure of the LED lighting apparatus in accordance with FIG. 1A and FIG. 1B.

As shown in FIG. 1C presenting the front elevation view of FIG. 1A or FIG. 1B, the first transparent conductive line 110 or 110' has a plurality of discontinuous conductive lines 1101 separated by the second transparent pattern 120, wherein the first transparent conductive line 110 is electrically insulated from the second transparent pattern 120. The second transparent pattern 120 is constituted by one surface of the transparent flexible tape. Alternatively, the second transparent pattern 120 may be constituted by an insulating material which is formed on the surface of the transparent flexible tape. In the embodiment, each LED 130 is electrically connected across two ends of the conductive lines 1101. Accordingly, one end of the conductive line 1101 is electrically connected to one or more exterior positive electrodes (not shown) and the other end to one or more exterior negative electrode (not shown), so as to electrically connect the LEDs 130 to an exterior power supply which provides power to the LEDs 130 by one or more sets of positive and negative power wires. In addition to the connection of exterior power, the first transparent conductive line 110 may be electrically connected to exterior control lines for controlling the performance of LEDs 130. Accordingly, the LEDs 130 may be a monochromatic LED or polychromatic LED, which are not limited to one type.

FIG. 2A is a cross-sectional diagram illustrating the plane structure of the LED lighting apparatus in accordance with a third embodiment of the present invention. A first transparent pattern is disposed on a transparent flexible tape 400, and, in this embodiment, the first transparent pattern is a transparent conductive film 420, which is divided into a first zone 460 and a second zone 470 by a second transparent pattern 410. In the embodiment, the transparent conductive film 420, not limited to, is made of transparent conductive material such as ITO or IZO, which is formed on the transparent flexible tape 400 by sputtering, evaporate plating, printing or attaching. It is understood that the transparent conductive film 420 may be made with a conductive material implanted a dye or dyes for visual arts. Next, the second transparent pattern 410 will be formed on the transparent conductive film 420 as an insulating pattern by a suitable method, such as laser, chemically etching, printing or cutting, to make the first zone 460 and the second zone 470 electrically insulating from each other.

FIG. 2B is a cross-sectional diagram illustrating one side of the plane structure of the LED lighting apparatus in accordance with FIG. 2A. The first transparent pattern includes the first zone 460 and the second zone 470, and either the first zone 460 or the second zone 470 may have some discontinuous blocks divided by the second transparent pattern 410. Next, all first blocks of the first zone 460 may electrically or physically be connected to one or more first exterior electrodes (in this embodiment, the first exterior electrodes are positive electrodes). Similarly, all second blocks of the second zone 470 may electrically or physically be connected to one or more second exterior electrodes which are different from the first exterior electrodes (in this embodiment, the second exterior electrodes are negative electrodes). Furthermore, one or more LEDs 430 are attached across the second transparent pattern 410, wherein each LED 430 has a positive electrode fixed on one first block of the first zone 460 and a negative electrode fixed on one second block of the second zone 470. Accordingly, the first zone 460 may be connected to one or more exterior positive electrodes, as well as the second zone 470 to one or more exterior negative electrodes.

It is understood, the LED lighting apparatus can be evolved as a double-side LED lighting apparatus by forming another first transparent pattern and another second transparent pattern on the other surface of the transparent flexible tape. That is, the first transparent patterns of both sides of the transparent flexible tape are made of conductive material. Besides, the conductive material may be selected from the groups consisted of transparent acrylic conductive gel, indium tin oxide, and indium zinc oxide. And, the second transparent pattern includes at least one of the surfaces of the transparent flexible tape or an insulation layer. And the only criterion to establish such a double-side LED lighting apparatus is that all LEDs on both sides of the lighting apparatus have to overlapped across positioned, as this result, the LED lighting apparatus can display the visual arts.

Figure 3:
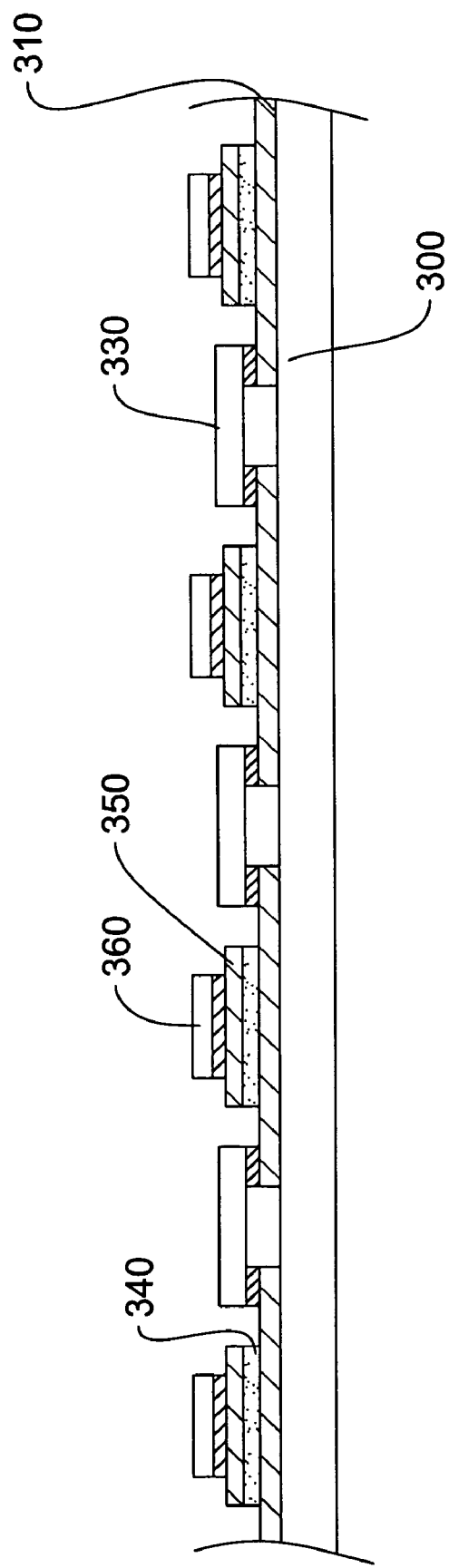
FIG. 3 is a cross-sectional diagram of the plane structure of the light-emitting diode lighting apparatus in accordance with a forth embodiment of the present invention.

FIG. 3 is a cross-sectional diagram of the plane structure of the light-emitting diode lighting apparatus in accordance with a forth embodiment of the present invention. A first transparent pattern is positioned on a transparent flexible tape 300, wherein the first transparent pattern is a plurality of first transparent conductive lines 310 in this embodiment, but not limited to. For the difference between this embodiment and the aforementioned embodiments, the second transparent pattern further includes a patterned insulation layer 340 disposed on the first transparent conductive lines 310, but two ends of the first transparent conductive lines 310 and the places which are going to place the first LEDs 330 are exposed out of the patterned insulation layer 340. The exposed ends of the first transparent conductive lines 310 are connected to a plurality of first LEDs 330. Next, in addition to the first transparent conductive lines 310, the first transparent pattern further includes a plurality of second transparent conductive lines 350 on the patterned insulation layer 340. The layout of the second transparent conductive lines 350 may be overlapped across the first transparent conductive lines 310. A plurality of second LEDs 360 is attached and electrically connected to the second transparent conductive lines 350. In the embodiment, the first transparent pattern is the first transparent conductive line 310 or the combination of the first transparent conductive line 310 and the second transparent conductive line 350 thereof, but not limited to, and the first transparent pattern can also be a transparent conductive film, which is aforementioned on the third embodiment. It is understood that another plane structure of the LED lighting apparatus form, which is the same as the previous embodiment, may also be formed on the other surface of the transparent flexible tape 300 to establish a double-side, multi-storey LED lighting apparatus. And the only criterion to establish such a double-side, multi-storey LED lighting apparatus is that all LEDs of the lighting apparatus have to overlapped across positioned, as this result, the LED lighting apparatus can display the visual arts.

Accordingly, one spirit of the present invention, one or more layers of LEDs may be stacked on one or both sides of a flexible plane structure with LEDs to enhance various applications.

Accordingly, the plane structure of LED lighting apparatus may have the LEDs in various amounts, sizes or kinds, such as monochromatic or polychromatic LEDs, in order to provide flexibility on designs. Next, the carrier of the LEDs made of flexible tape may be cut in various sizes and shapes, and, even more, the done plane structure of LED lighting apparatus may be positioned on a given shape or size carrier, such as a curve carrier, to meet with different designs. Thus, the plane structure of LED lighting apparatus in accordance with the present invention may be applied to indoor/outdoor partition, furniture, table, ceiling, shower partition, glass wall, display window, specific light stand, table decoration, advertisement or display panel, but not limited to.

Figure 4A:
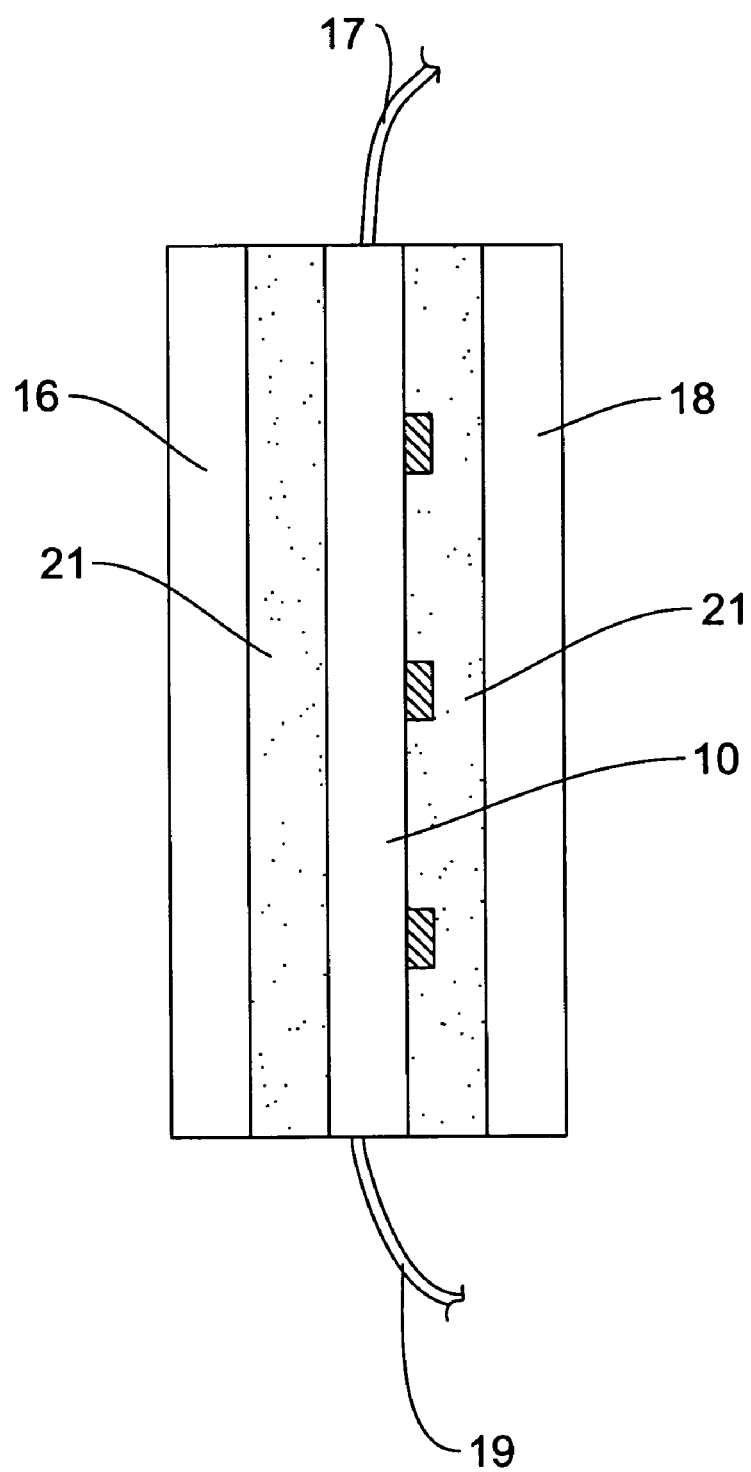
FIG. 4A and FIG. 4B are the side elevation view of a lighting apparatus in accordance with an embodiment of the present invention.
Figure 4B:
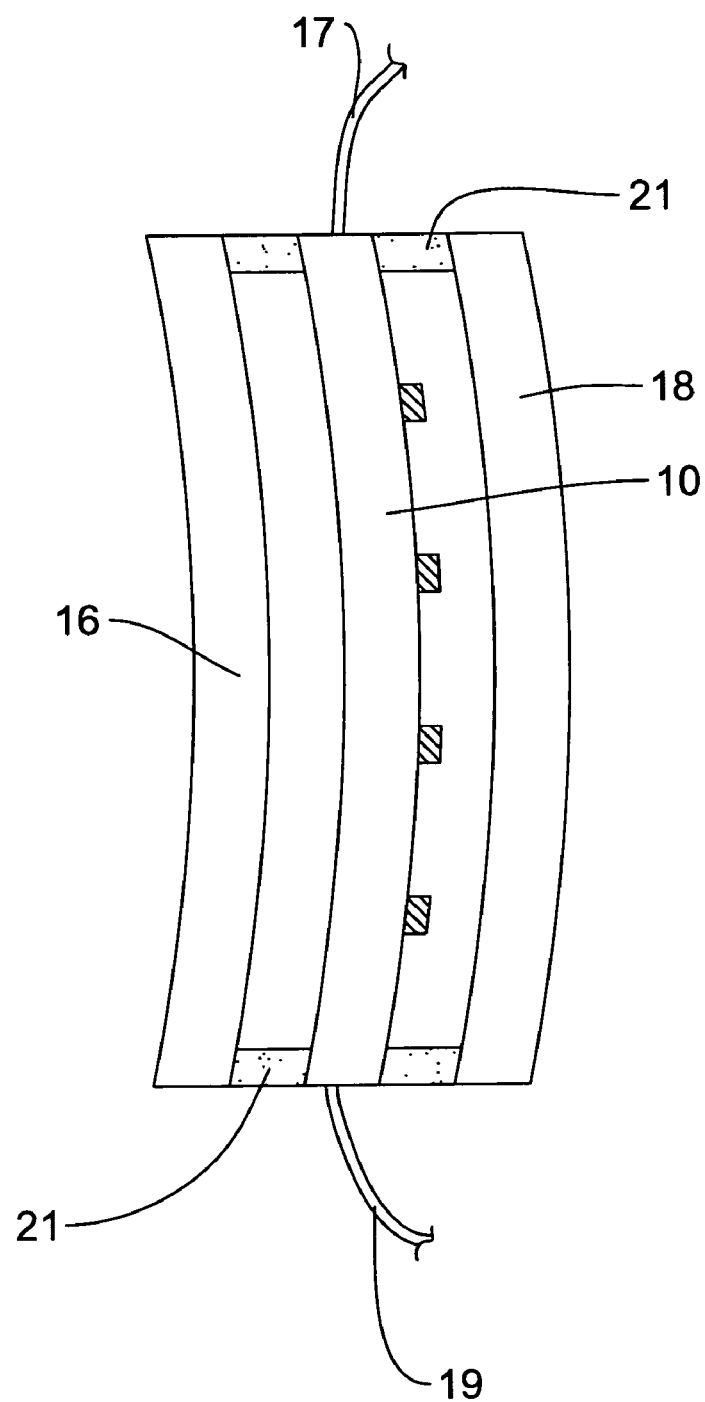

Please refer to FIG. 4A and FIG. 4B, are the side elevation view of a lighting apparatus in accordance with an embodiment of the present invention. The lighting apparatus 10 is inserted between two transparent rigid substrates 16 and 18 to form an LED peripheral product. The lighting apparatus 10 includes a power line 17 and a ground line 19, which are exposed out of the lighting apparatus 10, and an interlayer film 21, which is filled into the space between the lighting apparatus and two transparent rigid substrates 16 or 18 to protect LEDs. In the embodiment, the interlayer film 21 is made of poly vinyl butyral (PVB), EN, polyethylenenapthalate (PEN), ethyl vinyl acetate (EVA), or gel, but not limited to. And the material of the transparent rigid substrate 16 and 18 can be glass, polycarbonate, plastic, laminated glass or laminated plastic, but not limited to. Furthermore, the transparent rigid substrate 16 and 18 may be flat or curve type. In addition, the interlayer film 21 may be distributed over the plane structure of LED lighting apparatus (as shown in FIG. 4A) or the periphery of the lighting apparatus 10 (as shown in FIG. 4B).

Figure 5:
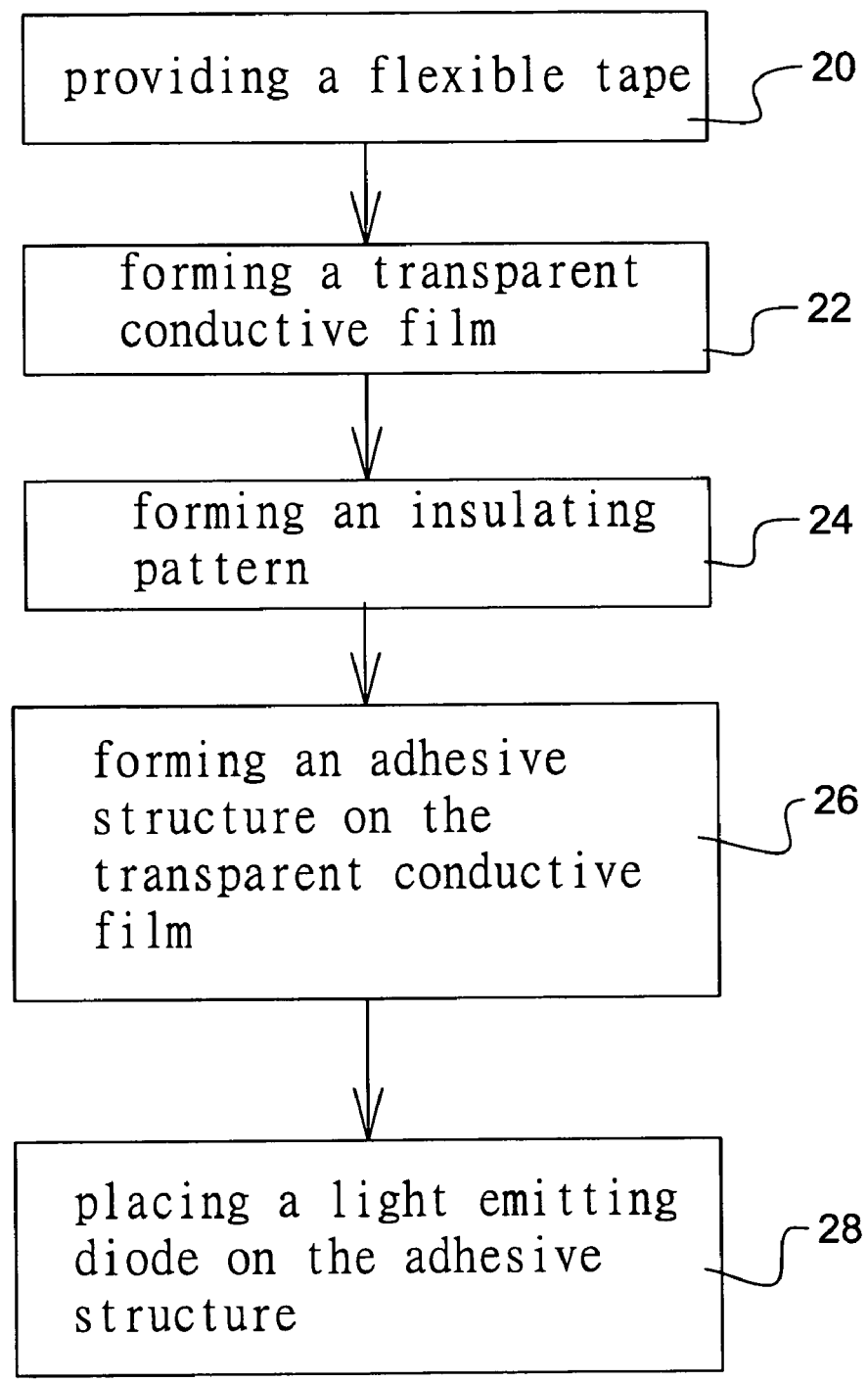
FIG. 5 is a flowchart illustrating the formation of the plane structure of the LED lighting apparatus in accordance with an embodiment of the present invention.

FIG. 5 is a flowchart illustrating the formation of the plane structure of the LED lighting apparatus in accordance with an embodiment of the present invention. A flexible tape is provided (step 20), and a transparent conductive film is formed on one or two sides of the flexible tape by any suitable method (step 22), such as sputtering, evaporate plating, printing, coating or film attaching. Next, an insulating pattern is done on the transparent conductive film in laser cutting, chemical etching or cutting (step 24). In one embodiment, the insulating pattern may include some lines to divide the transparent conductive film into some blocks, but not limited to the lines in the present invention. Some adhesive structures are formed on the pre-determined positions of the transparent conductive film (step 26), such as some conductive adhesive pads, which are formed by dipping method. Next, LEDs are attached on the adhesive structures (step 28). Alternatively, the dipping method is also employed to form conductive adhesive points directly on the pins of every LED, such as silver gel or solder on the pins, and then LEDs can be attached on the transparent conductive film.

Figure 6:
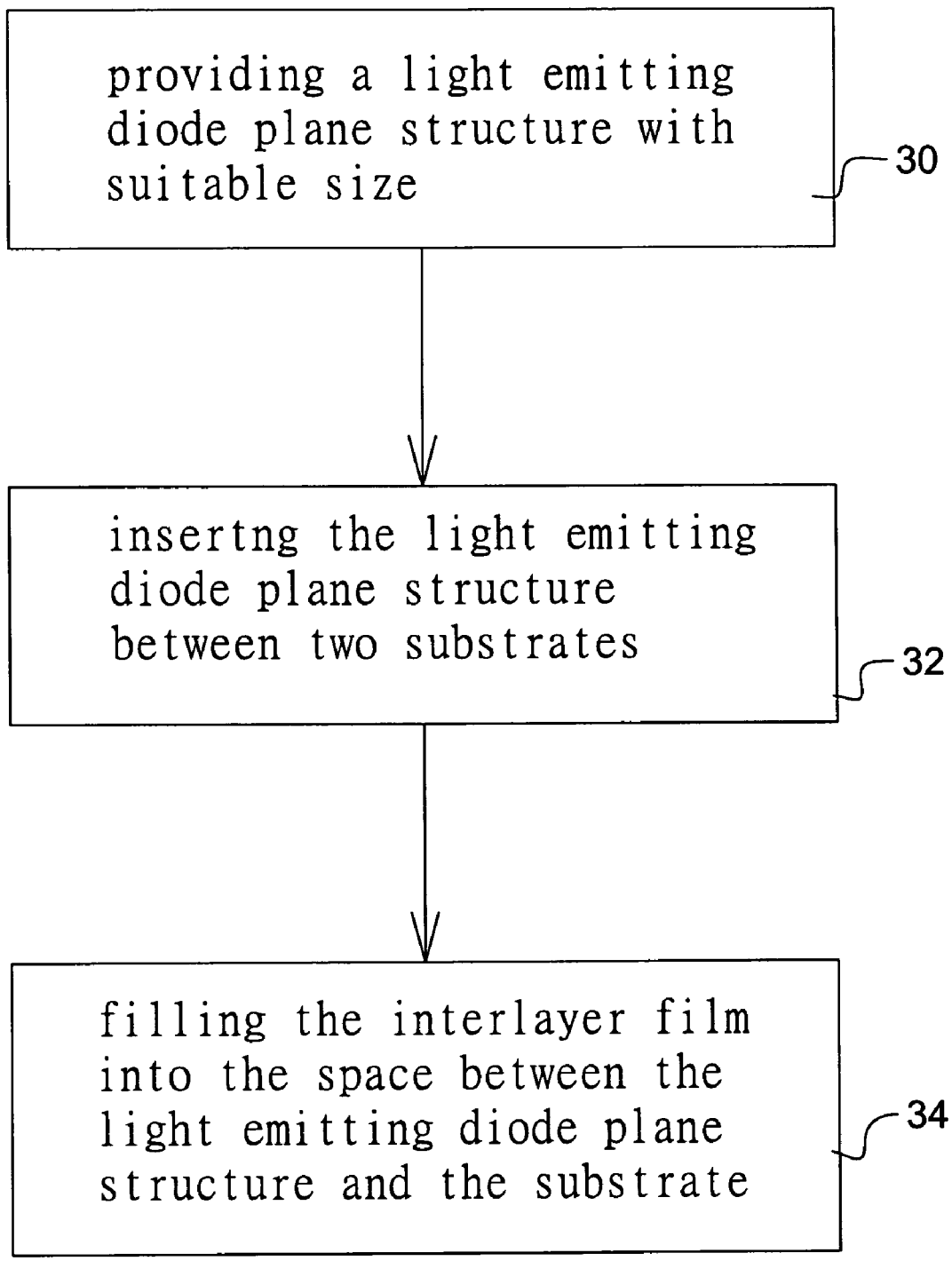
FIG. 6 is a flowchart illustrating the formation of the plane structure of the LED lighting apparatus in accordance with another embodiment of the present invention.

FIG. 6 is a flowchart illustrating the formation of the plane structure of the LED lighting apparatus in accordance with another embodiment of the present invention. The plane structure of the present invention may be fixed on any suitable substrate. For example, the plane structure of LED lighting apparatus according to the process shown in FIG. 1A may be cut into various sizes for different designs to provide coming assembly (step 30). It is understood that a flexible tape in any shape may be provided before the manufacture of the plane structure of LED lighting apparatus. Next, the plane structure of LED lighting apparatus may be inserted between two substrates (step 32), such as two transparent rigid glass substrates. Interlayer film is filled into the space between the plane structure of LED lighting apparatus and each substrate to protect LEDs (step 34). The interlayer film may be distributed on the periphery of the plane structure of LED lighting apparatus or over the plane structure of LED lighting apparatus. Alternatively, the interlayer film may be coated on a first substrate before the plane structure of LED lighting apparatus is positioned. Then the interlayer film (or the other) is coated on the plane structure on LED light apparatus and then covered with a second substrate.

Although the present invention has been explained in relation to its preferred embodiment, it is to be understood that other modifications and variation can be made without departing the spirit and scope of the invention as hereafter claimed.

What is claimed is:

1. A plane structure of light-emitting diode lighting apparatus, comprising:
   a transparent insulating flexible tape;
   a plurality of first transparent conductive lines positioned on a surface of said transparent insulating flexible tape;
   a plurality of first light-emitting diodes crossing and electrically connected to said first transparent conductive lines;
   a transparent patterned insulation layer positioned on said first transparent conductive lines, to cover a portion of said first transparent conductive lines and expose two ends of said first transparent conductive lines;
   a plurality of second transparent conductive lines on said transparent patterned insulation layer; and
   a plurality of second light-emitting diodes on said transparent insulating flexible tape and electrically connected said ends of said second transparent conductive lines.

2. A plane structure of light-emitting diode lighting apparatus according to claim 1, wherein second transparent conductive lines cross said first transparent conductive lines.

3. A plane structure of light-emitting diode lighting apparatus according to claim 1, further comprising a set of positive and negative power wires connecting said first transparent conductive lines to a power supply.

4. A plane structure of light-emitting diode lighting apparatus according to claim 1, wherein said first transparent conductive lines are positioned on two surfaces of said transparent insulating flexible tape.

5. A plane structure of light-emitting diode lighting apparatus, comprising:
   a transparent flexible tape;
   a transparent conductive film positioned on a surface of said transparent flexible tape, wherein said transparent conductive film has an insulating pattern to divide said transparent flexible tape into a first zone and a second zone, wherein said first zone comprises a plurality of first blocks electrically connected to a plurality of exterior positive electrodes, and said second zone comprises a plurality of second blocks electrically connected to a plurality of exterior negative electrodes;
   a plurality of light-emitting diodes positioned across said first zone and said second zone;
   two transparent rigid substrates, said transparent flexible tape being positioned between said two transparent rigid substrates, wherein said transparent flexible tape being spaced from at least one transparent rigid substrate; and
   an interlayer film filling the space between said transparent flexible tape and at least one of said transparent rigid substrates.

6. A plane structure of light-emitting diode lighting apparatus according to claim 5, further comprising a plurality of adhesive structures to attach said light-emitting diodes to said first transparent conductive film.

7. A plane structure of light-emitting diode lighting apparatus according to claim 5, wherein said first and second zones comprise a material selected from the group consisting of transparent acrylic conductive gel, indium tin oxide, and indium zinc oxide.

8. A plane structure of light-emitting diode lighting apparatus according to claim 5, further comprising a set of positive and negative power wires connecting said first and second zones to a power supply.

9. A plane structure of light-emitting diode lighting apparatus according to claim 5, wherein said light-emitting diodes comprise monochromatic and polychromatic light-emitting diodes.

10. A plane structure of light-emitting diode lighting apparatus according to claim 5, wherein said transparent flexible tape is made of an insulating material.

11. A plane structure of light-emitting diode lighting apparatus according to claim 5, further comprising a plurality of adhesive structures to attach said light-emitting diodes to said first and second zones.

12. A plane structure of light-emitting diode lighting apparatus according to claim 5, wherein said first zone is isolated from said second zone by said insulating pattern.

13. A plane structure of light-emitting diode lighting apparatus according to claim 12, wherein said insulating pattern is comprised of a gap.

14. A plane structure of light-emitting diode lighting apparatus according to claim 1, further comprising:
   two transparent rigid substrates, wherein said transparent insulating flexible tape, said first transparent conductive lines and said light-emitting diodes are positioned between said two transparent rigid substrates;

an interlayer film positioned between said transparent insulating flexible tape and one of said transparent rigid substrates; and a plurality of adhesive structures to attach said first and second light-emitting diodes to said first transparent conductive lines and said second transparent conductive lines, respectively.

15. A plane structure of light-emitting diode lighting apparatus, comprising:

a transparent flexible tape;

a transparent conductive film positioned on a surface of said transparent flexible tape, wherein said transparent conductive film has an insulating pattern to divide said transparent flexible tape into a first zone and a second zone, wherein said first zone comprises a plurality of first blocks electrically connected to a plurality of exterior positive electrodes, and said second zone comprises a plurality of second blocks electrically connected to a plurality of exterior negative electrodes;

a plurality of first light-emitting diodes positioned across said first zone and said second zone;

an insulation layer over a portion of said transparent conductive film;

a plurality of conductive lines on said insulation layer, wherein said conductive lines electrically connect said first zones or said second zones;

a plurality of adhesive structures on said conductive lines; and a plurality of second light-emitting diodes on said adhesive structures, wherein said second light-emitting diodes electrically connect said first zones and second zones.

* * * * *